(12) United States Patent
Jia

(10) Patent No.: US 11,258,014 B2
(45) Date of Patent: Feb. 22, 2022

(54) MANUFACTURING METHOD OF ORGANIC THIN FILM PATTERN

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Wenbin Jia, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 16/641,673

(22) PCT Filed: Sep. 16, 2019

(86) PCT No.: PCT/CN2019/105917
§ 371 (c)(1),
(2) Date: Feb. 25, 2020

(87) PCT Pub. No.: WO2020/057456
PCT Pub. Date: Mar. 26, 2020

(65) Prior Publication Data
US 2021/0151526 A1  May 20, 2021

(30) Foreign Application Priority Data
Sep. 20, 2018  (CN) .......................... 201811103309.8

(51) Int. Cl.
*H01L 51/00* (2006.01)
*H01L 27/32* (2006.01)
*H01L 51/56* (2006.01)

(52) U.S. Cl.
CPC ...... *H01L 51/0005* (2013.01); *H01L 27/3244* (2013.01); *H01L 51/56* (2013.01)

(58) Field of Classification Search
CPC . H01L 27/3244; H01L 51/56; H01L 51/0005; H01L 21/02288; H01L 51/0004
See application file for complete search history.

(56) References Cited

U.S. PATENT DOCUMENTS

2006/0110908 A1\* 5/2006 Moriya ................. H01L 21/288
                                                  438/617
2006/0236634 A1   11/2006 Yamazaki
                              (Continued)

FOREIGN PATENT DOCUMENTS

CN      1866567     11/2006
CN    101728547      6/2010
            (Continued)

OTHER PUBLICATIONS

Office action from Chinese Application No. 201811103309.8 dated Aug. 5, 2020.
(Continued)

*Primary Examiner* — Michael Jung
(74) *Attorney, Agent, or Firm* — Calfee, Halter & Griswold LLP

(57) ABSTRACT

Disclosed is a method for manufacturing an organic thin film pattern, an organic thin film pattern, an array substrate, and a display device. The method for manufacturing the organic thin film pattern includes the steps of forming a liquid droplet in a recessed portion of a thin film definition layer on a substrate, the liquid droplet being a solution containing an organic functional material, gelatinizing the liquid droplet, and performing a drying process on gelatinized liquid droplet to form an organic thin film pattern.

11 Claims, 3 Drawing Sheets

(56) References Cited

U.S. PATENT DOCUMENTS

| | | | |
|---|---|---|---|
| 2007/0269621 A1* | 11/2007 | Mitsuhashi | H01L 51/0003 428/34.1 |
| 2010/0092688 A1 | 4/2010 | Serbutoviez et al. | |
| 2011/0233572 A1 | 9/2011 | Nakatani et al. | |
| 2015/0132496 A1 | 5/2015 | Son | |
| 2016/0056218 A1* | 2/2016 | Wang | H01L 51/0004 257/40 |
| 2017/0213966 A1* | 7/2017 | Wang | H01L 51/0005 |
| 2017/0279049 A1* | 9/2017 | Dai | H01L 51/56 |
| 2018/0062078 A1* | 3/2018 | Watanabe | H01L 51/005 |
| 2019/0131373 A1 | 5/2019 | Sun | |
| 2019/0296239 A1 | 9/2019 | Jia | |

FOREIGN PATENT DOCUMENTS

| | | |
|---|---|---|
| CN | 102106186 | 6/2011 |
| CN | 104638198 | 5/2015 |
| CN | 105122492 | 12/2015 |
| CN | 105774279 | 7/2016 |
| CN | 106229410 | 12/2016 |
| CN | 107151483 A | 9/2017 |
| CN | 107425045 | 12/2017 |
| CN | 107731879 | 2/2018 |
| CN | 108258154 | 7/2018 |
| CN | 108281467 A | 7/2018 |
| CN | 108400259 | 8/2018 |
| CN | 110165055 | 8/2019 |
| EP | 2966702 | 1/2016 |
| EP | 3686933 | 7/2020 |

OTHER PUBLICATIONS

Office Action from Application No. 201811103309.8 dated Apr. 20, 2021 (12 pages).

* cited by examiner

MANUFACTURING METHOD OF ORGANIC THIN FILM PATTERN

RELATED APPLICATIONS

The present application is a 35 U.S.C. § 371 national stage application of PCT International Application No. PCT/CN2019/105917, filed on Sep. 16, 2019, which claims the benefit of Chinese Patent Application No. 201811103309.8, filed on Sep. 20, 2018, the entire disclosures of which are incorporated herein by reference.

TECHNICAL FIELD

The present disclosure relates to the field of display technology, and in particular, to a method for manufacturing an organic thin film pattern, an organic thin film pattern, an array substrate, and a display device.

BACKGROUND

Due to the advantages such as self-illuminating, being thin and light, low power consumption, high contrast, having a high color gamut, and ability to achieve a flexible display, organic light emitting diode (OLED) displays have been widely used in various electronic devices including electronics such as computers and mobile phones.

In related technologies, in the production of OLED displays, ink jet printing is generally used to print ink droplets to the openings in the pixel definition layer corresponding to the sub-pixels, and excess solvent is removed through subsequent drying and other processes, to form an organic light emitting functional pattern layer.

However, referring to FIG. 1, the lateral surface of the retaining wall B of the pixel definition layer is typically lyophilic and has a strong affinity for ink droplets. Therefore, during the drying process, the ink droplets climb along the lateral surface of the retaining wall. In addition, due to the coffee ring effect, the solute in the ink droplets quickly migrates to the edges and accumulates at the edges, resulting in unevenness of the dried film A (generally forming a U-shaped structure with a thin center and thick edges, or a W-shaped structure with thick center and thick edges), which in turn affects the life of the organic light emitting device.

SUMMARY

An aspect of the embodiments of the present disclosure provides a method for manufacturing an organic thin film pattern. The method for manufacturing the organic thin film pattern includes: forming a liquid droplet in a recessed portion of a thin film definition layer on a substrate, the liquid droplet being a solution containing an organic functional material; gelatinizing the liquid droplet; and performing a drying process on the gelatinized liquid droplet to form an organic thin film pattern.

Optionally, the step of forming the liquid droplet in the recessed portion of the thin film definition layer on the substrate includes using a solution process to form the liquid droplet in the recessed portion of the thin film definition layer on the substrate.

Optionally, the solution process is one of an ink jet printing process and a screen printing process.

Optionally, the step of using the solution process to form the liquid droplet in the recessed portion of the thin film definition layer on the substrate includes: using an ink jet printing process to print a first ink droplet containing the organic functional material into the recessed portion of the thin film definition layer; and using an ink jet printing process to print a second ink droplet as a gel system solvent into the recessed portion of the thin film definition layer. The first ink droplet and the second ink droplet are mutually soluble, thereby forming the liquid droplet.

Optionally, a volume of the second ink droplet is 10%~40% of a volume of the first ink droplet.

Optionally, the step of using the solution process to form the liquid droplet in the recessed portion of the thin film definition layer on the substrate includes: applying a liquid droplet of a mixed solution into the recessed portion of the thin film definition layer; the mixed solution including the organic functional material and a gel system solvent.

Optionally, the step of gelatinizing the liquid droplet includes: gelatinizing the liquid droplet by lowering its temperature.

Optionally, the step of gelatinizing the liquid droplet by lowering its temperature includes: gelatinizing the liquid droplet by lowering a temperature of an operation platform.

Optionally, the step of performing the drying process on the gelatinized liquid droplet to form the organic thin film pattern includes performing a vacuum freeze-drying process on the gelatinized liquid droplet to form the organic thin film pattern.

Optionally, at least a part of a lateral surface of the recessed portion close to the substrate is lyophilic.

Another aspect of the embodiments of the present disclosure also provides an organic thin film pattern, which is formed by using the aforementioned method.

Another aspect of the embodiments of the present disclosure further provides an array substrate including a plurality of organic light emitting diodes; each of the plurality of organic light emitting diodes includes an organic light emitting functional layer, and the organic light emitting functional layer is the organic thin film pattern according to the aforementioned embodiment.

Another aspect of the embodiments of the present disclosure further provides a display device including the aforementioned array substrate.

BRIEF DESCRIPTION OF THE DRAWINGS

In order to more clearly illustrate the technical solutions in embodiments of the disclosure or in the prior art, appended drawings needed to be used in the description of the embodiments or the prior art will be introduced briefly in the following. Obviously, the drawings in the following description are only some exemplary embodiments of the disclosure, and for those of ordinary skills in the art, other drawings may be obtained according to these drawings under the premise of not paying out creative work.

DETAILED DESCRIPTION OF THE DISCLOSURE

In the following, the technical solutions in exemplary embodiments will be described clearly and completely in connection with the drawings. Obviously, the described embodiments are only part of the embodiments of the disclosure, and not all of the embodiments. Based on the exemplary embodiments in the disclosure, all other embodiments obtained by those of ordinary skills in the art under the premise of not paying out creative work pertain to the protection scope of the disclosure.

Unless otherwise defined, the technical terms or scientific terms disclosed in the embodiments of the present disclosure shall have the ordinary meanings understood by those with ordinary skills in the field to which the present disclosure belongs. The terms "first", "second", and the like used in the embodiments of the present disclosure do not indicate any order, quantity, or importance, but are only used to distinguish different components. Words such as "including" or "comprising" mean that the element or item appearing before the words encompasses the element or item appearing after the words and its equivalent without excluding other elements or items. Words such as "connected" or "connection" are not limited to physical or mechanical connections, but may include electrical connections, whether direct or indirect. The words "up", "down", "left", "right", etc. are only used to indicate the relative position relationship. When the absolute position of the described object changes, the relative position relationship may also change accordingly.

The exemplary embodiments provide a method for manufacturing an organic thin film pattern, an organic thin film pattern, an array substrate, and a display device, which can solve the problem of unevenness thin film formed due to the coffee ring effect and the climbing phenomenon in the related art.

First, it should be noted that, the examples are illustrated in the following exemplary embodiments, in which the organic thin film pattern is formed as a light emitting functional layer (i.e., an emitting layer, or an EL layer) of an organic light emitting diode in a display panel. Those skilled in the art should understand that the present disclosure is not limited to this, and other similar thin film patterns can also be manufactured by using the manufacturing method described herein.

Figure 1:
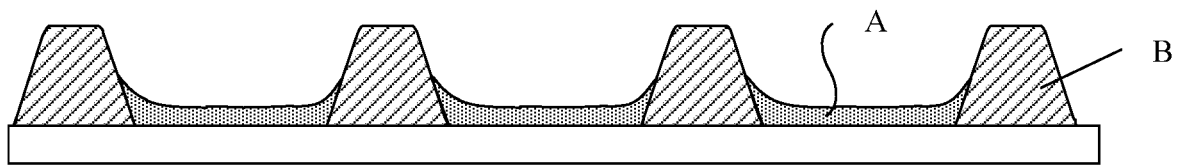
FIG. 1 is a schematic structural diagram of a thin film pattern provided in the related art.
Figure 2:
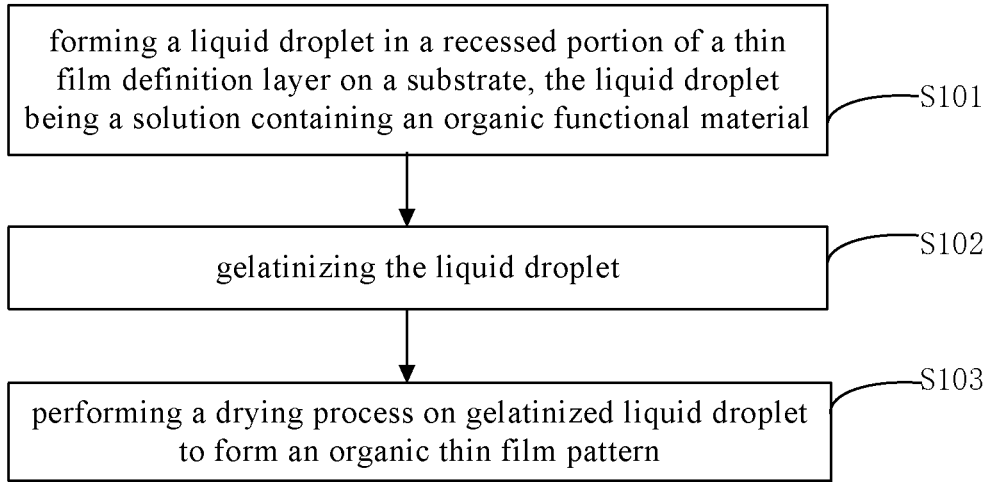
FIG. 2 is a flowchart of a method for manufacturing an organic thin film pattern according to an exemplary embodiment.

An exemplary embodiment provides a method for manufacturing an organic thin film pattern. As shown in FIG. 2, the method includes the following steps.

Figure 3:
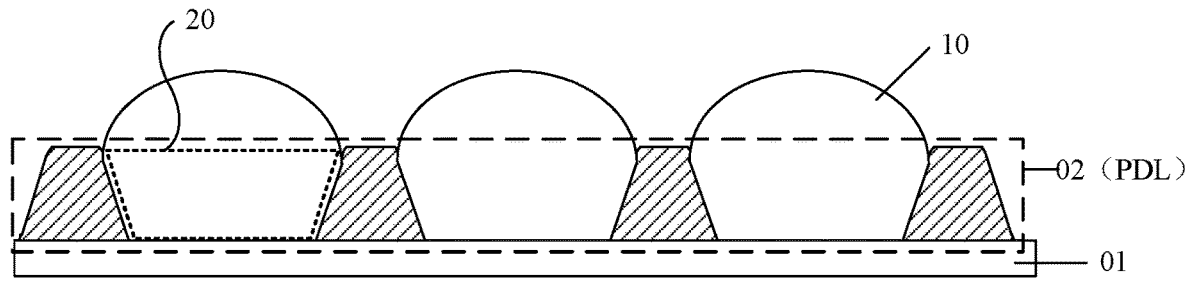
FIG. 3 is a schematic structural diagram of an organic thin film pattern during a manufacturing process according to an exemplary embodiment.

Step S101: referring to FIG. 3, a liquid droplet 10 is formed in a recessed portion 20 of a thin film definition layer 02 on a substrate 01. The liquid droplet 10 is a solution containing an organic functional material, and liquid droplet is capable of forming a gel.

In practice, optionally, a solution process may be used to form the liquid droplet 10 in the recessed portion 20 of the thin film definition layer 02 on the substrate 01. The specific mode of the solution process used in the present disclosure is not limited, as long as the liquid droplet 10 can be formed in the recessed portion 20. For example, in some exemplary embodiments, the solution process may be an ink jet printing (IJP) process; in other exemplary embodiments, the solution process may also be a screen printing process. Of course, considering the comprehensive factors such as the manufacturing process and film quality, the ink jet printing process is typically used in practice.

Specifically, referring to FIG. 3, for an OLED display panel, the substrate 01 is generally an array substrate formed with electronic devices (including thin film transistors, capacitors, and signal lines), and the thin film definition layer 02 is a pixel definition layer PDL. The liquid droplet 10 is used to form an organic light emitting functional layer in an organic light emitting diode, and the recessed portion 20 corresponds to an opening area of a sub-pixel.

Step S102: the liquid droplet is gelatinized.

Figure 4:
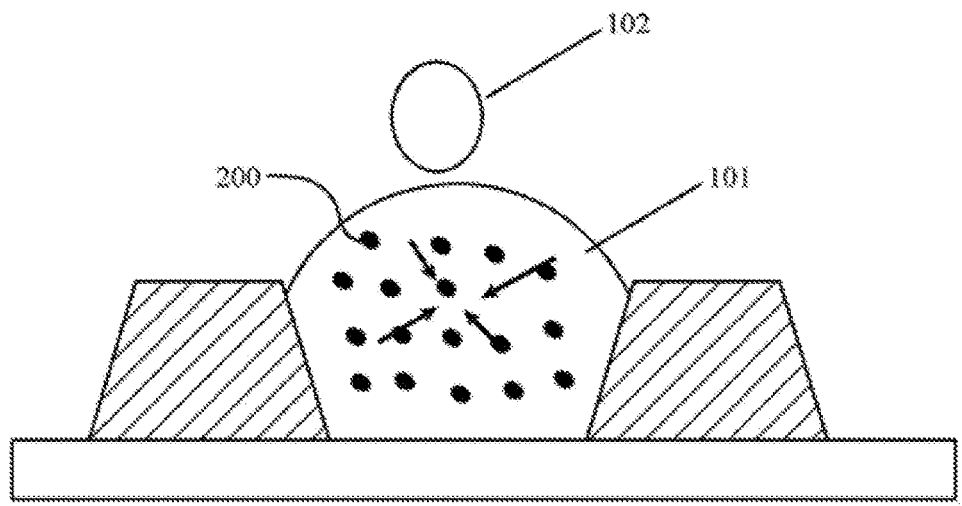
FIGS. 4 (a)-4(c) are schematic diagrams of a manufacturing process of an organic thin film pattern provided by an exemplary embodiment.
Figure 4:
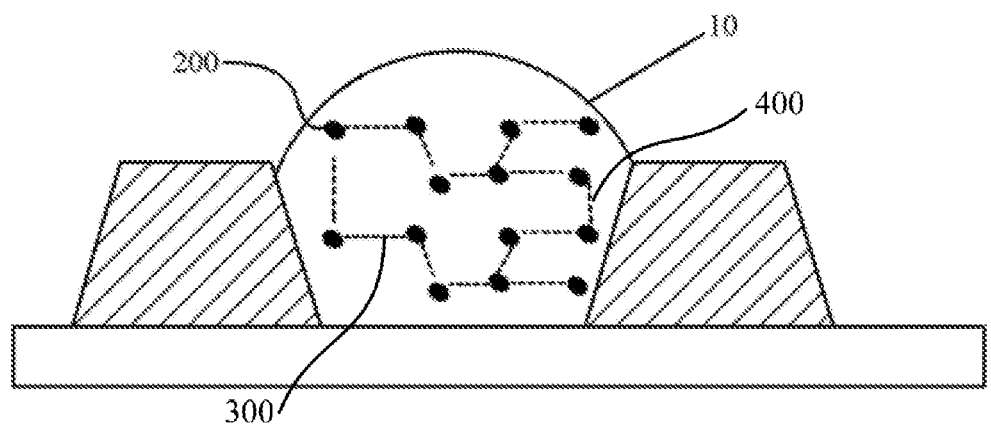
Figure 4:
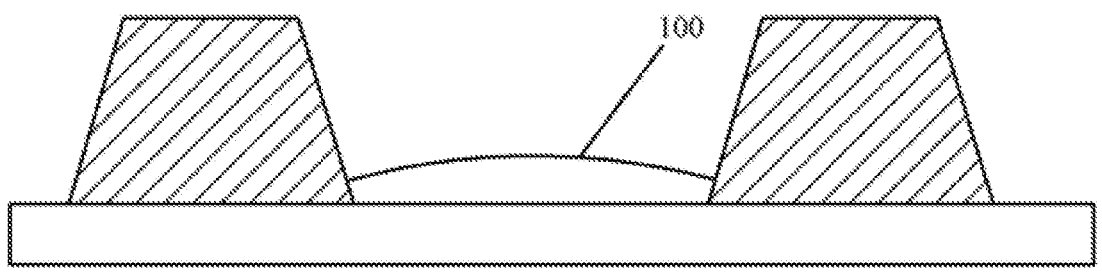

It should be noted that the above-mentioned gelation of the liquid droplet is substantially a process of gelation. Referring to FIG. 4 (b), the interaction of the gel system in the liquid droplet causes the solubility of the organic functional material 200 to decrease, and self-assembly aggregation occurs. The molecules are assembled into a linear structure through the action of the hydrogen bond 300, and the layers are connected to each other through the intermolecular force (π-π force) 400, forming a spatial network structure as a whole. Therefore, the viscosity of the liquid droplet increases, and the solution turbulence of the liquid droplet decreases, thereby slowing the migration of the liquid droplet to the edges and slowing the liquid droplet from climbing toward the lateral surface of the recessed portion.

In embodiments, the specific mode of the gelation is not limited, and may be achieved by changing the temperature, adding salts, adding a non-solvent, and the like. The specific mode of the gelation may be selected according to actual conditions.

Of course, in consideration of the actual manufacturing process, in order to avoid the introduction of unnecessary components in the liquid droplet system to cause the instability of its performance; and in consideration of the gelation process of most existing colloidal particles, optionally, the liquid droplet is gelatinized by lowering the temperature in exemplary embodiments.

It can be understood that, for the gelation of the liquid droplet in a manner of lowering the temperature, the liquid droplet can be cooled by lowering the temperature in the entire production environment; the liquid droplet can also be gelatinized by reducing the temperature of the operating platform (for the ink jet printing process, the operating platform is the printing machine), which is not specifically limited in this disclosure.

If the liquid droplet is cooled by lowering the temperature in the entire production environment, the energy consumption is large, and the cooling rate is slow. Optionally, the present disclosure gelatinizes the liquid droplet by lowering the temperature of the operation platform.

Step S103: referring to FIG. 4 (c), the gelatinized liquid droplet is dried to form an organic thin film pattern 100.

Specifically, since the viscosity of the liquid droplet after gelation increases and the solution turbulence of the liquid droplet is reduced, the coffee ring effect and the climbing phenomenon caused by the flow of the liquid droplet during the drying process are suppressed, thereby ensuring the uniformity of the formed organic thin film pattern.

In practice, in order to effectively ensure the uniformity of the organic thin film pattern 100, optionally, a vacuum freeze-drying process is used to dry the gelatinized liquid droplet to form the organic thin film pattern.

Specifically, the substrate with the gelatinized liquid droplets can be placed in a vacuum freeze-drying device to be cooled down, and air can be slowly evacuated to reduce the solvent of the entire liquid droplet system until drying is completed.

In summary, in exemplary embodiments, a liquid droplet containing an organic functional material and capable of forming a gel is formed in a recessed portion of a thin film definition layer, then the liquid droplet is gelatinized (that is, processed by a gelatinizing process) The organic functional material molecules in the liquid droplet form a spatial network structure. Therefore, the viscosity of the liquid droplet increases, and the solution turbulence of the liquid droplet is reduced, thereby slowing the migration of the liquid droplet to the edges and slowing the liquid droplet from climbing toward the lateral surface of the recessed portion. In this way the coffee ring effect and the climbing phenomenon are reduced, and the uniformity of the formed thin film is improved.

On this basis, in order to ensure the uniformity of the formed organic thin film pattern 100, in practice, at least a part of a lateral surface of the recessed portion 20 close to the substrate 01 is lyophilic. This part is lyophilic, so that the lateral surface of the recessed portion 20 has a strong affinity for the liquid droplet 10 inside the recessed portion 20, so as to ensure the uniformity of the organic thin film pattern 100 formed by drying.

It should be noted that at least a part of a lateral surface of the recessed portion 20 close to the substrate 01 is lyophilic may refer to that the entire lateral surface of the recessed portion 20 is lyophilic (for example, the thin film definition layer 02 may be made of a lyophilic material); it may also refer to that only the part of the lateral surface of the recessed portion 20 close to the substrate 01 is lyophilic, and a part of the lateral surface of the recessed portion 20 remote from the substrate 01 is lyophobic (for example, the thin film definition layer 02 may have a two-layer structure formed by a lyophilic material and a lyophobic material in sequence).

In the following example, the organic light emitting functional layer in the organic light emitting diode of the OLED display panel is formed by ink jet printing, so as to further explain the mechanism of the climbing phenomenon and the coffee ring effect in the organic light emitting functional layer during the drying process.

For the climbing phenomenon, the pixel definition layer PDL uses a dual-function material with a small surface energy at the top and a large surface energy at the bottom. The small surface energy at the top of the pixel definition layer PDL makes the surface lyophobic, thereby ensuring that the ink droplet (for forming the organic light emitting functional layer) do not overflow; the surface energy at the bottom of the pixel definition layer PDL is large so that the bottom of the pixel definition layer PDL is lyophilic, thereby ensuring that the ink droplet is completely spread in the opening area, to avoid pinhole leakage caused by the ink droplet incompletely spread on the pixel electrode in the opening area.

However, since only the top surface of the pixel definition layer PDL is lyophobic, and most parts under the top are lyophilic, the pixel definition layers PDL on both sides of the opening area have a strong affinity for the ink droplet. Therefore, during the drying process, the ink droplet climbs along the lyophilic part of the pixel definition layer PDL to the height of the lyophobic part, forming an uneven film with thick edges and a thin center. Such uneven thin film is likely to cause uneven light emission in the pixels of the device, thereby affecting the life of the device.

For the coffee ring effect, the edge of the ink droplet is fixed to the bottom of the opening area of the pixel definition layer during the drying process. The irregularity of the shape of the ink drop fixed on the bottom of the opening area causes the evaporation rate at the edge of the ink droplet is faster than the evaporation rate at the center of the ink droplet, therefore the solvent at the edge of the ink droplet loses more in the same time. In order to keep the edge of the ink droplet still fixed on the bottom of the opening area, a replenishing liquid flow is formed in the ink droplet from the center to the edge. Driven by the replenishing liquid flow, the solute in the ink droplet is migrated to the edge of the ink droplet, and a pile is formed at the edge, so that the coffee ring structure is formed. This results in a thin film with a thin center and a thick periphery.

In addition, the specific mode for forming the liquid droplet 10 in the recessed portion 20 of the thin film definition layer 02 on the substrate 01 using the ink jet printing process is further explained below.

Specifically, as shown in FIG. 4 (*a*), a first ink droplet 101 containing an organic functional material is printed into the recessed portion 20 of the thin film definition layer 02 by using an ink jet printing process; a second ink droplet 102 as a gel system solvent is printed into the recessed portion 20 of the thin film definition layer 02 by using an ink jet printing process; the first ink droplet 101 and the second ink droplet 102 are mutually soluble, thereby forming the liquid droplet.

It should be noted that in the case of forming the liquid droplet 10 through two ink jet printing processes, as shown in FIG. 4 (*a*), the first ink droplet 101 can be formed first, and then the second ink droplet 102 can be formed, the first ink droplet 101 and the second ink droplet 102 are mutually soluble to form the liquid droplet 10 (FIG. 4 (*b*)); it is also possible to form the second ink droplet first, and then form the first ink droplet, the first ink droplet and the second ink droplet are mutually soluble to form the liquid droplet. The present disclosure does not specifically limit the formation sequence, which can be selected according to actual needs. Of course, the first ink droplet 101 is typically formed before the second ink droplet 102 is formed.

For forming the light emitting layer of the OLED, the first ink droplet may be a solution formed by dissolving a light emitting material in a solvent such as 1,3-dimethyl-2-imidazolinone, diethylene glycol, 2-(2-methoxyethoxy) ethanol, and the second ink drop may be a solvent such as furan, pyridine, polycarbonate and aromatic hydrocarbon.

For forming the hole injection layer of the OLED, the first ink droplet may be a solution formed by dissolving a hole injection material in a solvent such as cyclohexylbenzene, polycarbonate, alkanes, and aromatic hydrocarbon, and the second ink droplet may be a solvent such as ethanol, isopropanol, and water.

For forming the hole transport layer of the OLED, the first ink droplet may be a solution formed by dissolving a hole transport material in a solvent such as aromatic ester, 4-methylanisole, and toluene, and the second ink droplet may be a solvent such as ethanol, isopropanol, and water.

In addition, in order to ensure the uniformity and stable functions of the formed organic thin film pattern 100, optionally, the volume of the second ink droplet 102 is 10%~40% of the volume of the first ink droplet 101.

Specifically, the volume of the second ink droplet 102 is greater than or equal to 10% of the volume of the first ink droplet 101, so that the liquid droplet 10 formed by mixing the first ink droplet 101 and the second ink droplet 102 can be effectively gelatinized, thereby significantly avoiding the climbing phenomenon and coffee ring effect generated during the drying process. The volume of the second ink droplet 102 is less than or equal to 40% of the volume of the first ink droplet 101, so that the liquid droplet 10 formed by mixing the first ink droplet 101 and the second ink droplet 102 has sufficient organic functional material, and the thin film formed by the drying process has sufficient organic functional material, thereby ensuring stable functions of the thin film. Therefore, optionally, the volume of the second ink droplet 102 is 10%~40% of the volume of the first ink droplet 101.

Optionally, the liquid droplet of the mixed solution containing the organic functional material and the gel system solvent may also be applied to the recessed portion of the thin film definition layer by using another solution process, that is, the liquid droplet of the mixed solution containing the organic functional material and the gel system solvent may be applied to the recessed portion of the thin film definition layer in a single process.

An exemplary embodiment further provides an organic thin film pattern, which is formed by using the foregoing method for manufacturing an organic thin film pattern. The organic thin film pattern has a uniform composition, a uniform thickness, and stable functions, and has the same structure and beneficial effects as the organic thin film pattern provided in the foregoing embodiments. Since the structure and beneficial effects of the organic thin film pattern have been described in detail in the foregoing embodiments, details are not described herein again.

An exemplary embodiment further provides an array substrate including the aforementioned organic thin film pattern; the organic thin film pattern is formed by using the aforementioned method for manufacturing an organic thin film pattern. The array substrate has the same structure and beneficial effects as the organic thin film pattern provided by the foregoing embodiments. Since the structure and beneficial effects of the organic thin film pattern have been described in detail in the foregoing embodiments, details are not described herein again.

Those skilled in the art should understand that the above-mentioned array substrate typically includes a plurality of organic light emitting diodes; the above-mentioned organic thin film pattern is an organic light emitting functional layer of the organic light emitting diodes in the array substrate. The organic light emitting functional layer has a uniform thickness, so that the organic light emitting diode emits light uniformly and has stable performance, improving the life of the organic light emitting diode.

Of course, the aforementioned substrate 01 is a substrate provided with electronic devices (for example, thin film transistors, capacitors, etc.), the aforementioned thin film definition layer 02 is the pixel definition layer PDL on the array substrate, and the recessed portion 20 of the thin film definition layer 02 is an opening in the pixel definition layer PDL for a single sub-pixel.

An exemplary embodiment further provides a display device including the foregoing array substrate (i.e., including the foregoing organic thin film pattern). The organic thin film pattern is formed by using the foregoing organic thin film pattern manufacturing method, and has the same structure and beneficial effects as the organic thin film pattern provided by the foregoing embodiments. Since the structure and beneficial effects of the organic thin film pattern have been described in detail in the foregoing embodiments, details are not described herein again. In addition, the pixels of the display device emit light uniformly, the performance is stable, and the life of the display device is improved.

The above exemplary embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, the patent protection scope of the present disclosure should be defined by the claims.

What is claimed is:

1. A method for manufacturing an organic thin film pattern, comprising:
   forming a liquid droplet in a recessed portion of a thin film definition layer on a substrate, the liquid droplet being a solution containing an organic functional material;
   gelatinizing the liquid droplet; and
   performing a drying process on gelatinized liquid droplet to form an organic thin film pattern,
   wherein forming the liquid droplet in the recessed portion of the thin film definition layer on the substrate comprises:
   using a solution process to form the liquid droplet in the recessed portion of the thin film definition layer on the substrate,
   wherein using the solution process to form the liquid droplet in the recessed portion of the thin film definition layer on the substrate comprises:
   using an ink jet printing process to print a first ink droplet containing the organic functional material into the recessed portion of the thin film definition layer; and
   using an ink jet printing process to print a second ink droplet as a gel system solvent into the recessed portion of the thin film definition layer; the first ink droplet and the second ink droplet being mutually soluble, thereby forming the liquid droplet.

2. The method according to claim 1, wherein the solution process is one of an ink jet printing process and a screen printing process.

3. The method according to claim 2, wherein at least a part of a lateral surface of the recessed portion close to the substrate is lyophilic.

4. The method according to claim 1, wherein a volume of the second ink droplet is 10%~40% of a volume of the first ink droplet.

5. The method according to claim 4, wherein at least a part of a lateral surface of the recessed portion close to the substrate is lyophilic.

6. The method according to claim 1, wherein gelatinizing the liquid droplet comprises:
   gelatinizing the liquid droplet by lowering a temperature.

7. The method according to claim 6, wherein gelatinizing the liquid droplet by lowering a temperature comprises:
   gelatinizing the liquid droplet by lowering a temperature of an operation platform.

8. The method according to claim 7, wherein at least a part of a lateral surface of the recessed portion close to the substrate is lyophilic.

9. The method according to claim 6, wherein at least a part of a lateral surface of the recessed portion close to the substrate is lyophilic.

10. The method according to claim 1, wherein performing the drying process on the gelatinized liquid droplet to form the organic thin film pattern comprises:
    performing a vacuum freeze-drying process on the gelatinized liquid droplet to form the organic thin film pattern.

11. The method according to claim 1, wherein at least a part of a lateral surface of the recessed portion close to the substrate is lyophilic.

* * * * *